US012768877B2

(12) United States Patent
Wang et al.

(10) Patent No.: US 12,768,877 B2
(45) Date of Patent: Oct. 20, 2026

(54) METHOD FOR ESTIMATING PERFORMANCE VALUES OF CHIPS, COMPUTING SYSTEM, AND NON-TRANSITORY COMPUTER-READABLE STORAGE MEDIUM

(71) Applicants: GLOBAL UNICHIP CORPORATION, Hsinchu City (TW); TAIWAN SEMICONDUCTOR MANUFACTURING COMPANY, LTD., Hsinchu (TW)

(72) Inventors: Ting-Hao Wang, Hsinchu City (TW); Pei-Ju Lin, Hsinchu City (TW); Mark Po-Hung Lin, Hsinchu City (TW); Shuo-Hung Hsu, Hsinchu City (TW); Shu-Hsiang Yang, Hsinchu City (TW)

(73) Assignees: GLOBAL UNICHIP CORPORATION, Hsinchu City (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 497 days.

(21) Appl. No.: 18/544,454

(22) Filed: Dec. 19, 2023

(65) Prior Publication Data

US 2025/0012851 A1 Jan. 9, 2025

(30) Foreign Application Priority Data

Jul. 7, 2023 (TW) ................................ 112125499

(51) Int. Cl.
*G01R 31/28* (2006.01)
*G06N 3/08* (2023.01)

(52) U.S. Cl.
CPC ........... *G01R 31/2834* (2013.01); *G06N 3/08* (2013.01)

(58) Field of Classification Search
CPC .............................. G01R 31/2834; G06N 3/08
See application file for complete search history.

(56) References Cited

U.S. PATENT DOCUMENTS 9,502,956 B1 11/2016 Yeo et al.
2008/0036487 A1* 2/2008 Bradley ........... G01R 31/31708 324/762.02

(Continued)

OTHER PUBLICATIONS

Brousard, Early and Fine Virtual Binning, Sep. 2020 (Year: 2020).*

(Continued)

*Primary Examiner* — Shourjo Dasgupta
*Assistant Examiner* — Jacqueline C. Meyer
(74) *Attorney, Agent, or Firm* — CKC & Partners Co., LLC

(57) ABSTRACT

A method for estimating performance values of chips includes: (A) using oscillation period vectors of a to-be-divided set to train a first neural network model to obtain a training error of the to-be-divided chip set, where in the first-time conducted step (A), the to-be-divided chip set includes the chips; (B) dividing the to-be-divided chip set into divided chip sets according to the training error; and (C) using oscillation period vectors of the divided chip sets as training data of a second neural network model, so that the second neural network model outputs weight vectors respectively corresponding to the divided chip sets. A product of oscillation period vector(s) of each divided chip set and a weight vector of the divided chip set is larger than a product of the oscillation period vector(s) of the divided chip set and a weight vector of each of rest of divided chip sets.

20 Claims, 5 Drawing Sheets

(56) References Cited

U.S. PATENT DOCUMENTS

| | | | | |
|---|---|---|---|---|
| 2021/0249288 A1* | 8/2021 | Briggs | ................... | G06N 20/00 |
| 2022/0011795 A1* | 1/2022 | Rifani | ................ | G01R 31/3004 |
| 2025/0124207 A1* | 4/2025 | Songhori | .............. | G06F 30/392 |

OTHER PUBLICATIONS

Chan et al., Synthesis and Analysis of Design-Dependent Ring Oscillator (DDRO) Performance Monitors, Oct. 2014 (Year: 2014).*

Goldie et al., Chip Desing with Deep Reinforcement Learning, Apr. 2020 (Year: 2020).*

Mihiroseini et al., Chip Placement with Deep Reinforcement Learning, Oct. 2020 (Year: 2020).*

Mu et al., Statistical Framework and Built-In Self-Speed-Binning System for Speed Binning Using On-Chip Ring Oscillators, May 2016 (Year: 2016).*

Roy et al., Designing Arithmetic Circuits with Deep Reinforcement Learning, Jul. 2022 (Year: 2022).*

Wang et al., A Novel Machine-Learning based SoC Performance Monitoring Methodology under Wide-Range PVT Variations with Unknown Critical Paths, 2021 (Year: 2021).*

Sartori et al., Variation-Aware Speed Binning of Multi-core Processors, 2010 (Year: 2010).*

* cited by examiner

METHOD FOR ESTIMATING PERFORMANCE VALUES OF CHIPS, COMPUTING SYSTEM, AND NON-TRANSITORY COMPUTER-READABLE STORAGE MEDIUM

RELATED APPLICATIONS

This application claims priority to Taiwan Application Serial Number 112125499, filed on Jul. 7, 2023, which is herein incorporated by reference in its entirety.

BACKGROUND

Technical Field

The present disclosure relates to a technology to estimate chip performance values. More particularly, the present disclosure relates to a method for estimating a plurality of performance values of a plurality of chips, a computing system and a non-transitory computer-readable storage medium.

Description of Related Art

A critical path may be used to estimate performances of integrated circuits, since a signal delay of the critical path determines a maximum frequency of a chip. In different process-voltage-temperature (PVT) situations, the critical path of the chip may change. Output of ring oscillators may change according to PVT variations, therefore outputs of ring oscillators are often used to construct formulas to estimate chip performance values (i.e., a propagation delay of the critical path). However, different chips may have different PVT-to-delay sensitivities. In this situation, the performance values of different chips may not be estimated by the same formula.

SUMMARY

The present disclosure provides a method for estimating a plurality of performance values of a plurality of chips. The method includes following steps: (A) using a plurality of oscillation period vectors of a to-be-divided chip set to train a first neural network model corresponding to the to-be-divided chip set, to obtain a training error of the to-be-divided chip set, in which when step (A) is conducted for the first time, the to-be-divided chip set includes the plurality of chips; (B) dividing the to-be-divided chip set into a plurality of divided chip sets according to the training error; and (C) using a plurality of oscillation period vectors of the plurality of divided chip sets as training data of a second neural network model, so that the second neural network model outputs a plurality of weight vectors respectively corresponding to the plurality of divided chip sets. A product of one or more oscillation period vectors of each divided chip set and a weight vector of the divided chip set is larger than a product of the one or more oscillation period vectors of the divided chip set and a weight vector of each of rest of divided chip sets.

The present disclosure provides a non-transitory computer-readable storage medium configured to store one or more computer-readable instructions. When one or more processors executing the one or more computer-readable instructions, the one or more computer-readable instructions cause the one or more processors to conduct following steps to estimate a plurality of performance values of a plurality of chips: (A) using a plurality of oscillation period vectors of a to-be-divided chip set to train a first neural network model corresponding to the to-be-divided chip set, to obtain a training error of the to-be-divided chip set, in which when step (A) is conducted for the first time, the to-be-divided chip set includes the plurality of chips; (B) dividing the to-be-divided chip set into a plurality of divided chip sets according to the training error; and (C) using a plurality of oscillation period vectors of the plurality of divided chip sets as training data of a second neural network model, so that the second neural network model outputs a plurality of weight vectors respectively corresponding to the plurality of divided chip sets. A product of one or more oscillation period vectors of each divided chip set and a weight vector of the divided chip set is larger than a product of the one or more oscillation period vectors of the divided chip set and a weight vector of each of rest of divided chip sets.

The present disclosure provides a computing system including one or more processors. The one or more processors are configured to conduct following steps to estimate a plurality of performance values of a plurality of chips: (A) using a plurality of oscillation period vectors of a to-be-divided chip set to train a first neural network model corresponding to the to-be-divided chip set, to obtain a training error of the to-be-divided chip set, in which when step (A) is conducted for the first time, the to-be-divided chip set includes the plurality of chips; (B) dividing the to-be-divided chip set into a plurality of divided chip sets according to the training error; and (C) using a plurality of oscillation period vectors of the plurality of divided chip sets as training data of a second neural network model, so that the second neural network model outputs a plurality of weight vectors respectively corresponding to the plurality of divided chip sets. A product of one or more oscillation period vectors of each divided chip set and a weight vector of the divided chip set is larger than a product of the one or more oscillation period vectors of the divided chip set and a weight vector of each of rest of divided chip sets.

One of advantages of the aforementioned method, non-transitory computer-readable storage medium and computing system is to estimate a plurality of performance values of a plurality of chips with different PVT-to-delay sensitivities accurately without extracting critical paths of chips.

It is to be understood that both the foregoing general description and the following detailed description are by examples, and are intended to provide further explanation of the disclosure as claimed.

DETAILED DESCRIPTION

Figure 1:
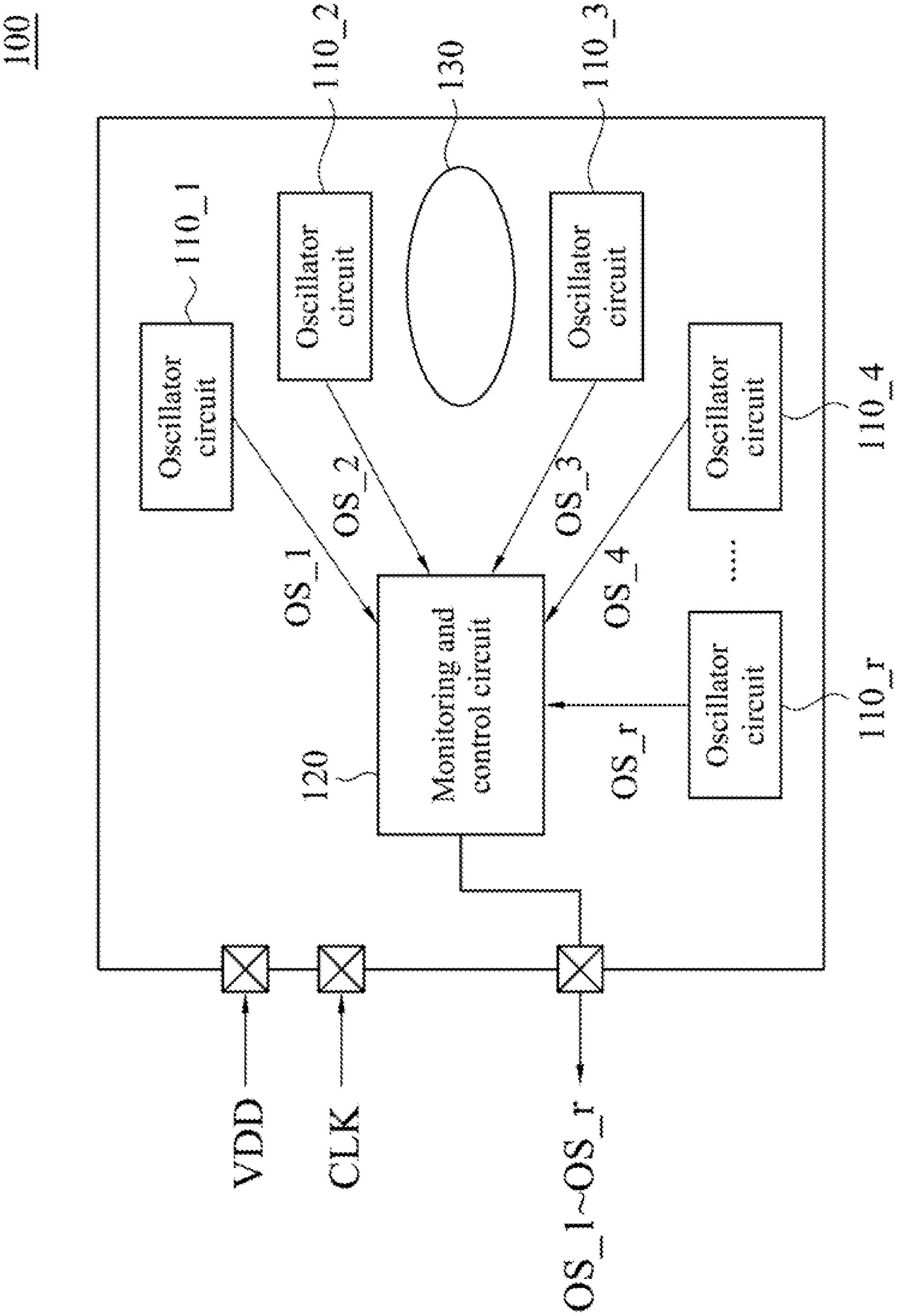
FIG. 1 is a simplified functional block diagram of a chip according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified functional block diagram of a chip 100. The chip 100 is configured to receive a working voltage VDD and a system clock CLK, and comprises a plurality of oscillator circuits 110_1-110_*r* and a monitoring and control circuit 120. The oscillator circuits 110_1-110_*r* are located at different locations in the chip 100. The oscillator circuits 110_1-110_*r* are configured to generate a plurality of oscillation signals OS_1-OS_r, respectively. The monitoring and control circuit 120 is coupled to the oscillator circuits 110_1-110_*r*, configured to receive the oscillation signals OS_1-OS_r, and configured to conduct signal processing such as filtering and amplifying the oscillation signals OS_1-OS_r. The monitoring and control circuit 120 is further configured to output the oscillation signals OS_1-OS_r.

In some embodiments, each of the oscillator circuits 110_1-110_*r* can be implemented with a ring oscillator. In some embodiments, a period of each of the oscillation signals OS_1-OS_r is configured to reflect a process-voltage-temperature (PVT) variation of a respective location corresponding to the oscillation signal.

It is worth mentioning that at least a part of the oscillator circuits 110_1-110_*r* are located near a critical path 130 of the chip 100, so that the oscillation signals OS_1-OS_r may be used to estimate the performance of the chip 100. By reducing the working voltage VDD, the power consumption of the chip 100 may be reduced, but the sum of the propagation delay and the setup time of the critical path 130 may also be increased. When the sum of the propagation delay and the setup time of the critical path 130 is increased to approximately equal to the system clock period Tcycle of the system clock CLK, the chip 100 may enter a failure state. Therefore, in some embodiments, estimating the performance of the chip 100 means to calculate the sum of the propagation delay and the setup time of the critical path 130 when the chip 100 is operated under a predetermined voltage VDD, so as to help achieve a balance between power consumption and performance when designing the chip 100.

Utilizing the characteristic that the periods of the oscillation signals OS_1-OS_r may change according to the working voltage VDD, a performance estimating function of the single chip 100 may be represented by the following Formula 1.

$$Tes = T_{1\times r} \times K_{1\times r}^T \quad \text{(Formula 1)}$$

Here "Tes" represents the performance value of the chip 100, that is, the sum of the propagation delay and the setup time of the critical path 130; "$T_{1\times r}$" is an 1×r array, where the r elements thereof are the periods of the oscillation signals OS_1-OS_r of the chip 100, respectively, and r is a positive integer;

"$K_{1\times r}^T$"

is an 1×r array representing a weight vector of the chip 100.

In some embodiments that a simultaneous estimation of a plurality of performance values of chips 100 is needed, different critical paths 130 of chips 100 may have different PVT-to-delay sensitivities. Therefore, in order to estimate the plurality of performance values of the chips 100 accurately, Formula 1 needs to be adjusted to the following Formula 2. For the convenience of explanation, in the following embodiments, the number of the chips 100 whose performance values need to be estimated is assumed to be 5. However, the present disclosure is not limited thereto; Formula 2 may be applied to estimate performance values of any number of chips 100.

$$Tes_{5\times 1} = \max_j\left(T_{5\times r} \times K_{1\times r,j}^T\right) \quad \text{(Formula 2)}$$

Figure 2:
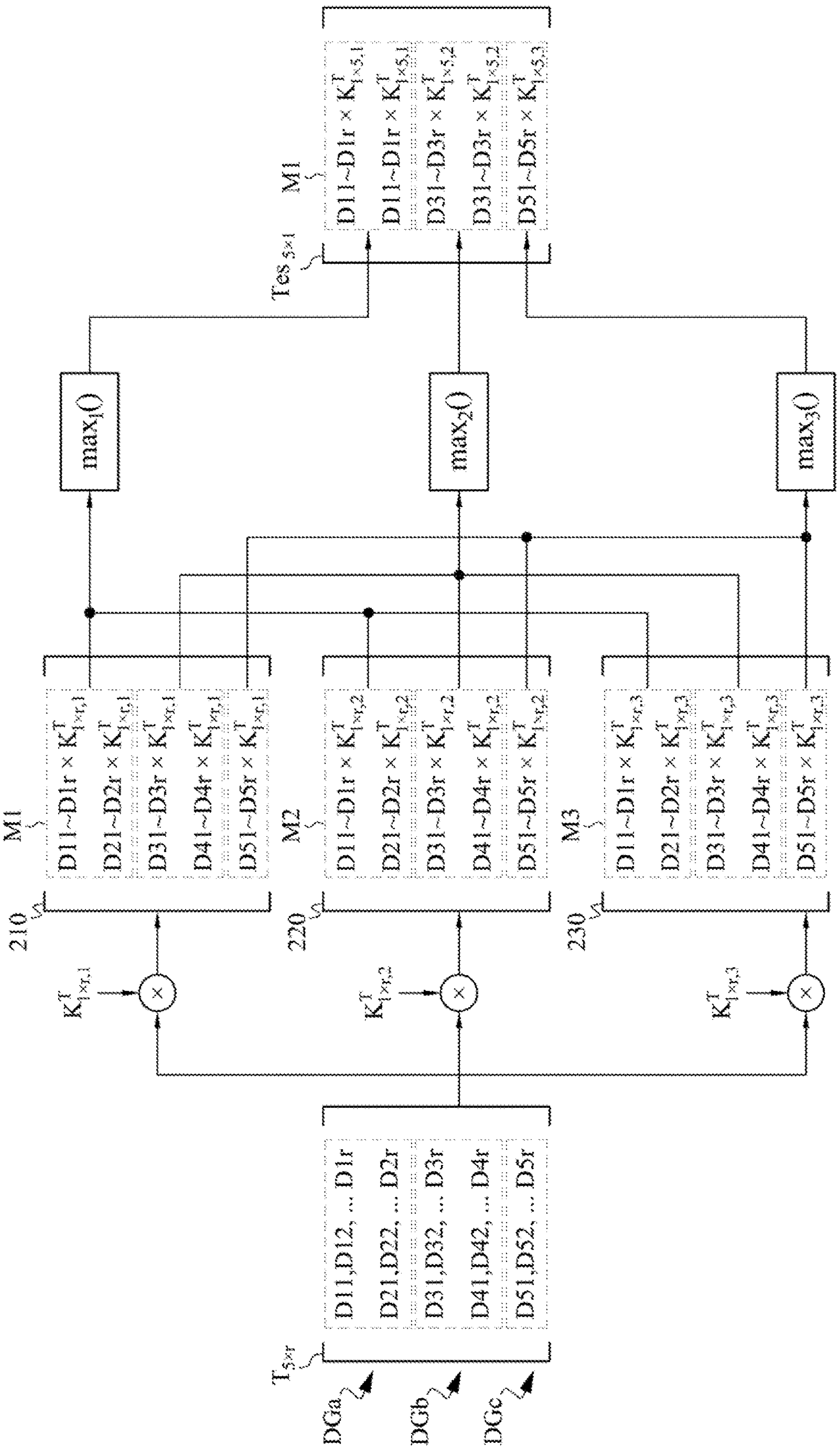
FIG. 2 is a schematic diagram illustrating Formula 2 according to one embodiment of the present disclosure.

Referring to FIG. 2, FIG. 2 is a schematic diagram for illustrating Formula 2 according to one embodiment of the present disclosure. Array $Tes_{5\times 1}$ is a 5×1 array, with each element being a performance value of a chip 100, therefore $Tes_{5\times 1}$ comprises 5 performance values of chips 100. $T_{5\times r}$ is a 5×r array, with each row vector (hereinafter refer to as an "oscillation period vector") records periods OS_1-OS_r of the oscillation signals of the chips 100. For example, a first row vector [D11, D12, . . . D1*r*] and a second row vector [D21, D22, . . . D2*r*] of the array $T_{5\times r}$ record the periods of the oscillation signals OS_1-OS_r of two different chips 100, respectively. Therefore, the array $T_{5\times r}$ records 5 periods of the oscillation signals of chips 100.

It is worth mentioning that the 5 chips 100 are divided into 3 divided chip sets DGa-DGc according to the PVT-to-delay sensitivity. In the array $T_{5\times r}$, three dashed boxes represent the divided chip sets DGa-DGc from top to bottom, respectively. The numbers of chips 100 in the divided chip sets DGa-DGc are 2, 2 and 1, respectively. However, the number of divided chip sets and the numbers of chips 100 in divided chip sets are not limited thereto, where each divided chip set may comprise at least one chip 100. The grouping method for chips 100 is illustrated with reference to FIG. 3-FIG. 5. In some embodiments, chips 100 in the same set have the same or similar PVT-to-delay sensitivities.

The weight vector $$K_{1\times r,j}^T$$

is an 1×r array representing the weight vector of the j-th divided chip set, where j is a positive integer in the range of 1 to 3 since there are 3 divided chip sets in total. That is, as shown in FIG. 2, the weight vector $$K_{1\times r,j}^T$$

comprises 3 different weight vectors $$K_{1\times r,1}^T,\ K_{1\times r,2}^T \text{ and } K_{1\times r,3}^T.$$

It is worth mentioning that, as shown in FIG. 2, the array $T_{5\times r}$ will be multiplied by the each of the weight vectors $$K_{1\times r,1}^T,\ K_{1\times r,2}^T \text{ and } K_{1\times r,3}^T.$$

Therefore, taking the divided chip set DGa as an example, the oscillation period vectors of the divided chip set DGa (i.e., the first row vector [D11, D12, . . . D1*r*] and the second row vector [D21, D22, . . . D2*r*] of the array $T_{5\times r}$), will be multiplied by not only the weight vector $$K^T_{1\times r,1}$$

of the divided chip set DGa, but also the two weight vectors $$K^T_{1\times r,2} \text{ and } K^T_{1\times r,3}$$

of the divided chip sets DGb and DGc. Therefore, the products M1-M3 related to the oscillation period vectors of the divided chip set DGa will be located in 3 arrays 210-230, respectively.

The operator $\max_j(\ )$ is used to select the maximum over the products related to the oscillation period vector(s) of the j-th divided chip set as one or more elements of the array $Tes_{5\times 1}$. Taking the divided chip set DGa as an example, the operator $\max_1(\ )$ thereof is used to select the maximum over the products M1-M3. Ideally, the product M1 of the plurality of oscillation period vectors of the divided chip set DGa (i.e., the first and the second row vectors of the array $T_{5\times r}$) and the weight vector $$K^T_{1\times r,1}$$

of the divided chip set DGa, will be larger than the products M2 and M3 of the plurality of oscillation period vectors of the divided chip set DGa and the weight vectors $$K^T_{1\times r,2} \text{ and } K^T_{1\times r,3}$$

of the rest of the divided chip sets DGb and DGc, where the reason is illustrated with reference to FIG. 3-FIG. 5. In this situation, the product M1 will be the first and the second elements of the array $Tes_{5\times 1}$. Accordingly, a product of one or more oscillation period vectors of each of the plurality of divided chip sets and the weight vector of the divided chip set (e.g., the product M1), will be larger than products of the one or more oscillation period vectors of the divided chip set and the weight vector of each of the rest of the divided chip sets (e.g., the products M2 and M3).

In some embodiments, the product M1 is larger than products M2 and M3; that is, every element in the product M1 is larger than an element of the products M2 and M3 at the respective position. For example, the element $$\text{“}D11 - D1r \times K^T_{1\times r,1}\text{”}$$

of the product M1 is larger than the element $$\text{“}D11 - D1r \times K^T_{1\times r,2}\text{”}$$

of M2, and the element $$\text{“}D11 - D1r \times K^T_{1\times r,3}\text{”}$$

of M3.

The process of estimating the performance values of the rest of the divided chip sets of aforementioned 5 chips 100 by Formula 2, and the functions of operators $\max_2(\ )$ and $\max_3(\ )$, are all similar to their corresponding part in the aforementioned plurality of embodiments about the first divided chip set. For simplicity, the detailed descriptions thereof are omitted here.

In some embodiments, since the periods of the oscillation signals OS_1-OS_r are all measureable, the row vectors of the array $T_{5\times r}$ are known. However, since the PVT-to-delay sensitivities of the chips 100 may be hardly measured directly, the values in the weight vector $$K^T_{1\times r,j}$$

and the grouping method of the chips 100 (e.g., the total number of the divided chip sets and the divided chip set that each of the chips 100 belongs to) may not be determined by measuring the chips 100.

Figure 3:
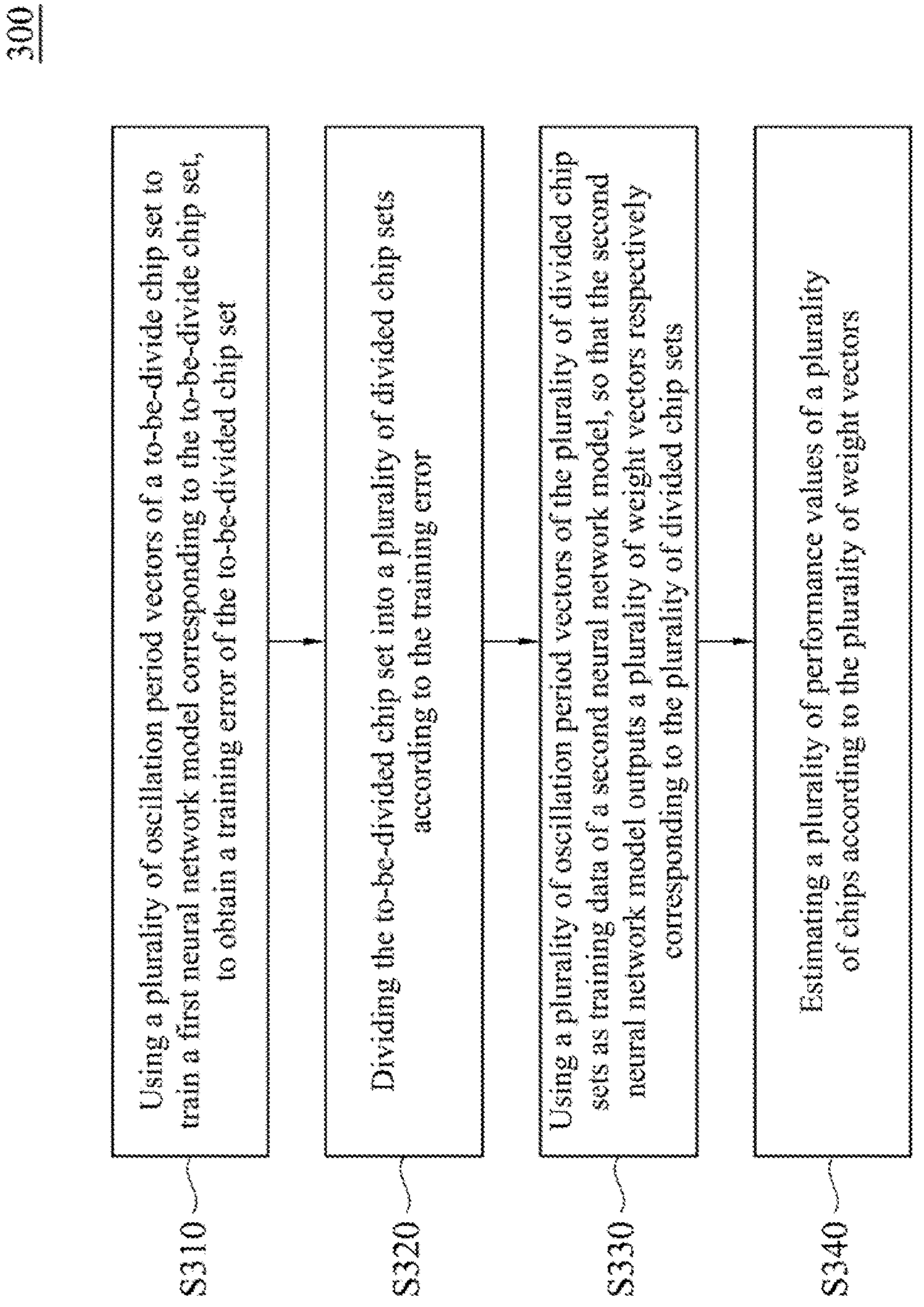
FIG. 3 is a flowchart of a method for estimating a plurality of performance values of a plurality of chips according to one embodiment of the present disclosure.

Thereof, to construct Formula 2, the present disclosure provides a method 300 for estimating the plurality of performance values of the plurality of chips 100, which is illustrated in FIG. 3. Any combination of features of the method 300 can be implemented with a plurality of instructions stored in a non-transitory computer-readable storage medium. When executing the instructions by one or more processors in a computing system (not depicted, e.g., a personal computer, a laptop or other suitable device with logical computing capabilities), the instructions may cause some or all of the method 300 to be conducted. It will be understood that, the method 300 may include more or less steps than those shown in the flowchart, and steps in the method 300 may be conducted in any suitable order.

In some embodiments, the computing system is coupled to the aforementioned 5 chips 100, and is configured to receive the periods of the oscillation signals OS_1-OS_r of each of the 5 chips 100.

Figure 4:
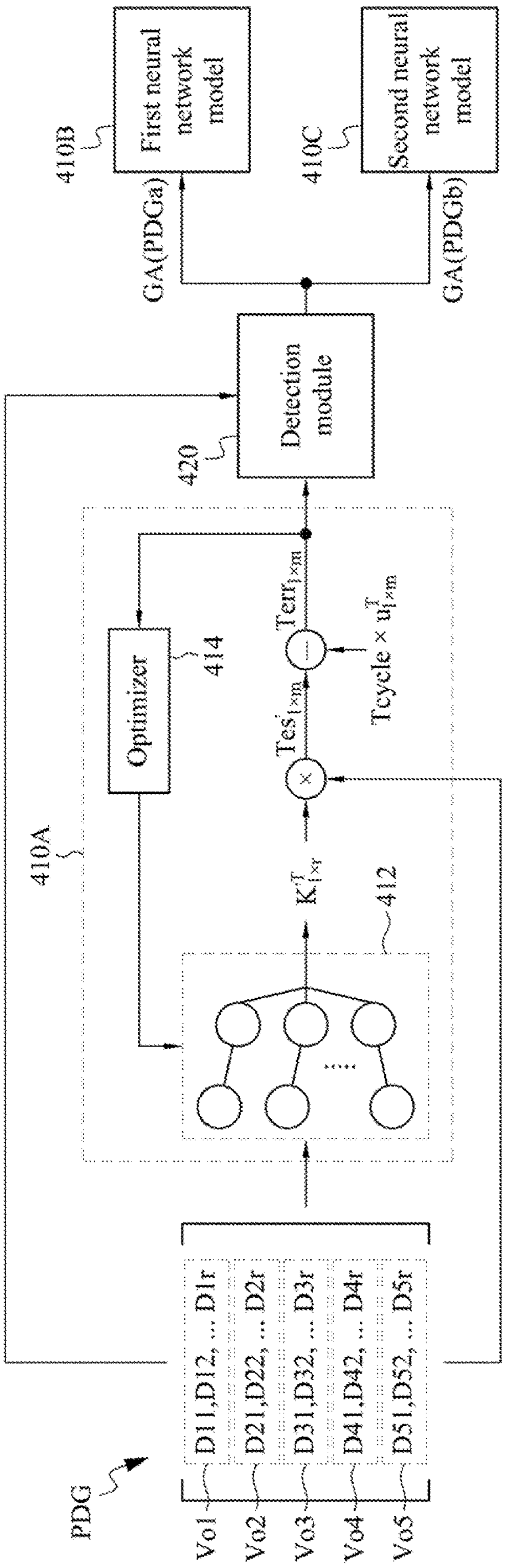
FIG. 4 is a schematic diagram illustrating steps S310-S320 according to one embodiment of the present disclosure.

Referring to FIG. 3-FIG. 4, where FIG. 4 is a schematic diagram for illustrating steps S310-S320 according to one embodiment of the present disclosure. When conducting step S310 for the first time, the computing system takes all the chips 100 whose performance values need to be estimated as a to-be-divided chip set PDG, that is, the to-be-divided chip set PDG comprises 5 chips 100. Then, the computing system uses a plurality of oscillation period vectors Vo1-Vo5 of the to-be-divided chip set PDG to train a first neural network model 410A corresponding to the to-be-divided chip set PDG, where the oscillation period vectors Vo1-Vo5 record periods of the oscillation signals OS_1-OS_r of the 5 chips 100, respectively.

More specifically, in step S310, the computing system may take the oscillation period vectors Vo1-Vo5 as training data of the first neural network model 410A, and then input the oscillation period vectors Vo1-Vo5 into a multi-layer neural structure 412 of the first neural network model 410A, so that the first neural network model 410A generates an initial weight vector $$K'^{T}_{1\times r}$$

corresponding to the to-be-divided chip set PDG, where the initial weight vector $$K'^{T}_{1\times r}$$

is an 1×r array. In some embodiments, the first neural network model 410A may be implemented with a feedforward neural network (FNN) model.

Then, to calculate the training error $Terr_{1\times m}$, the computing system will calculate products (hereinafter refer to as the initial performance value $$Tes'_{1\times m}$$

of the to-be-divided chip set PDG) of the oscillation period vectors Vo1-Vo5 and the initial weight vector $$K^{T}_{1\times r}$$

first, where the initial performance value $$Tes'_{1\times m}$$

is an 1×m array, and m is the number of chips 100 in the to-be-divided chip set PDG. Then, the computing system will subtract the product of a unit vector $$u^{T}_{1\times m}$$

and the system clock period Tcycle of the system clock CLK from the initial performance value $$Tes'_{1\times m},$$

to obtain the training error $Terr_{1\times m}$. In other words, the loss function of the first neural network model 410 is the following Formula 3.

$$Terr_{1\times m} = Tes'_{1\times m} - Tcycle \times u^{T}_{1\times m} \qquad \text{(Formula 3)}$$

The computing system will provide the training error $Terr_{1\times m}$ to the optimizer 414 of the first neural network model 410A. The optimizer 414 is configured to adjust the weights of the multi-layer neural structure 412 according to the training error $Terr_{1\times m}$, which in turn adjusts the initial weight vector $$K'^{T}_{1\times r},$$

so as to minimize the training error $Terr_{1\times m}$. In some embodiments, the optimizer 414 may be implemented with an Adam optimizer. Accordingly, the computing system may adjust the initial weight vector $$K'^{T}_{1\times r},$$

so as to minimize training error $Terr_{1\times m}$ where the training error $Terr_{1\times m}$ is related to the following two terms: (1) the product of the system clock period Tcycle and the unit vector $$u^{T}_{1\times m},$$

and (2) the products of the plurality of oscillation period vectors Vo1-Vo5 of the to-be-divided chip set PDG and the initial weight vector $$K'^{T}_{1\times r}.$$

Then, in step S320, the computing system is configured to divide the to-be-divided chip set PDG into a plurality of chip sets according to the training error $Terr_{1\times m}$. More specifically, the computing system will provide the minimized training error $Terr_{1\times m}$ to a detection module 420. The detection module 420 is configured to judge whether the m elements in the minimized training error $Terr_{1\times m}$ are in a normal distribution. If the detection module 420 determines the training error $Terr_{1\times m}$ not in a normal distribution, the detection module 420 will divide the to-be-divided chip set PDG into two chip sets GA and GB, where the each of the chip sets GA and GB comprises at least one chip 100. In some embodiments, the detection module 420 uses k-means clustering to divide the to-be-divided chip set PDG into chip sets GA and GB, and the chip(s) 100 in the same set have same or similar PVT-to-delay sensitivities.

In step S320, the computing system will further take the chip sets GA and GB as to-be-divided chip sets PDGa and PDGb, respectively, to repeat steps S310-S320 on each of the chip sets GA and GB (i.e., the to-be-divided chip sets PDGa and PDGb). In other words, as shown in FIG. 4, one or more oscillation period vectors of the to-be-divided chip set PDGa will be used to train a first neural network model 410B corresponding to the to-be-divided chip set PDGa, and one or more oscillation period vectors of the to-be-divided chip set PDGb will be used to train a first neural network model 410C corresponding to the to-be-divided chip set PDGb. The first neural network models 410B and 410C are both similar to the first neural network model 410A. For simplicity, the training process of the first neural network models 410B and 410C are omitted here.

Figure 5:
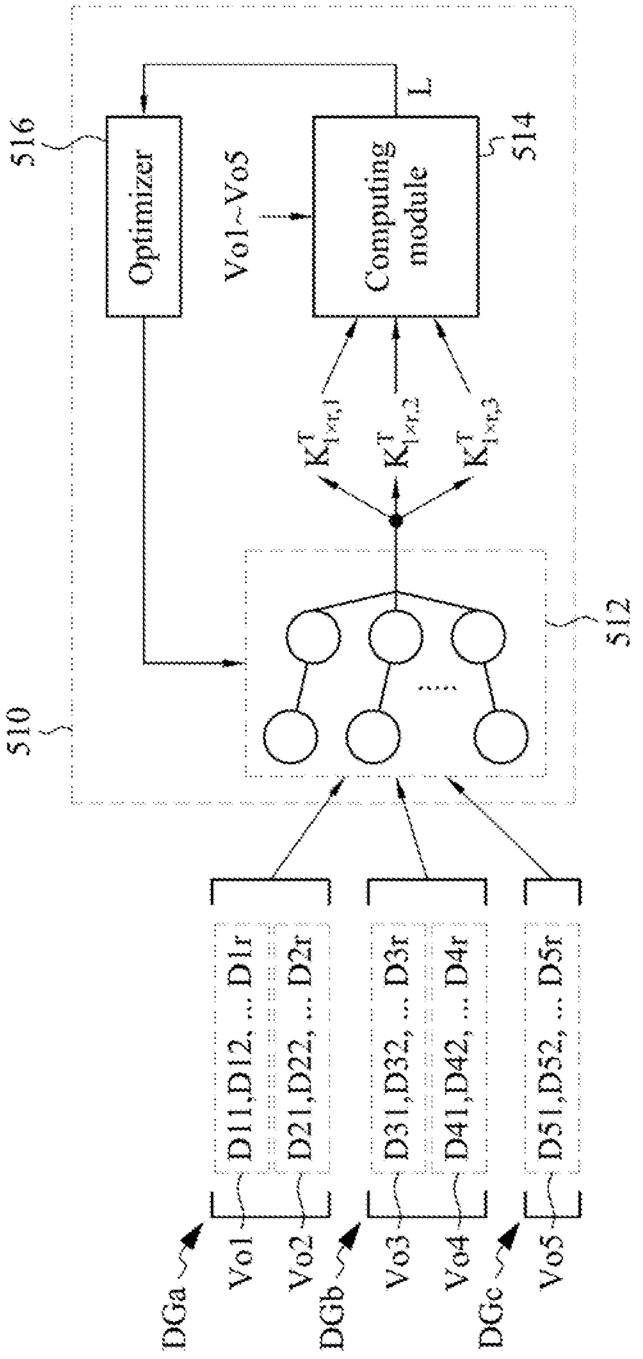
FIG. 5 is a schematic diagram illustrating step S330 according to one embodiment of the present disclosure.

In addition, after conducting steps S310-S320 for one or more times, if the detection module 420 determines, in step S320, that the training error $Terr_{1\times m}$ of each chip set is in normal distribution, the computing system will take all the chip sets as the plurality of divided chip sets DGa-DGc in FIG. 5, and then conduct step S330. In some embodiments, normal distribution means that the average of all elements in the training error $Terr_{1\times m}$ is 0 or approximately 0.

Referring to FIG. 5, FIG. 5 is a schematic diagram of step S330 according to one embodiment of the present disclosure. The divided chip sets DGa-DGc in FIG. 5 are the divided chip sets DGa-DGc in the array $T_{5\times r}$ of FIG. 2. Each of the divided chip sets DGa-DGc comprises at least one chip 100, therefore each of the divided chip sets DGa-DGc has one or more oscillation period vectors. In step S330, the computing system will use the oscillation period vectors Vo1-Vo5 of the divided chip sets DGa-DGc as training data of a second neural network model 510. In some embodiments, the second neural network model 510 may be implemented with an FNN model.

At first, the computing system uses the oscillation period vectors Vo1-Vo5 as training data of a second neural network model 510, and input into a multi-layer neural structure 512 of the second neural network model 510, so that the multi-layer neural structure 512 outputs the weight vectors $$K^T_{1\times r,1},\ K^T_{1\times r,2} \text{ and } K^T_{1\times r,3}$$

corresponding to the divided chip sets DGa-DGc, respectively.

Then, the computing system inputs the oscillation period vectors Vo1-Vo5 and the weight vectors $$K^T_{1\times r,1},\ K^T_{1\times r,2} \text{ and } K^T_{1\times r,3}$$

into a computing module 514 of the second neural network model 510. The computing module 514 will calculate a training error L of the divided chip sets DGa-DGc, and the loss function used to calculate the training error L is represented by the following Formula 4.

$$\begin{aligned} L = \alpha\times\big[&(\text{Tmain\_a} - Tcycle)^2 + (\text{Tmain\_b} - Tcycle)^2 + (\text{Tmain\_c} - Tcycle)^2\big] + \\ &\beta\times[SiLU(\text{Tother\_1a} - Tcycle) + SiLU(\text{Tother\_2a} - Tcycle) + \\ &SiLU(\text{Tother\_1b} - Tcycle) + SiLU(\text{Tother\_2b} - Tcycle) + \\ &SiLU(\text{Tother\_1c} - Tcycle) + SiLU(\text{Tother\_2c} - Tcycle)] \end{aligned} \quad \text{(Formula 4)}$$

In Formula 4, the arrays Tmain_a, Tmain_b and Tmain_c represent "the product of the oscillation period vectors Vo1-Vo2 and the weight vector $$K^T_{1\times r,1}\text{"},$$

"the product of the oscillation period vectors Vo3-Vo4 and the weight vector $$K^T_{1\times r,2}\text{"},$$

and "the product of the oscillation period vector Vo5 and weight vector $$K^T_{1\times r,3}\text{"},$$

respectively.

Furthermore, in Formula 4, the arrays Tother_1*a* and Tother_2*a* represent "the product of the oscillation period vectors Vo1-Vo2 and the weight vector $$K^T_{1\times r,2}$$

of the divided chip set DGb" and "the product of the oscillation period vectors Vo1-Vo2 and the weight vector $$K^T_{1\times r,3}$$

of the divided chip set DGc", respectively. The arrays Tother_1*b* and Tother_2*b* represent "the products of the oscillation period vectors Vo3-Vo4 and the weight vector $$K^T_{1\times r,1}$$

of the divided chip set DGa" and "the products of the oscillation period vectors Vo3-Vo4 and the weight vector $$K^T_{1\times r,3}$$

of the divided chip set DGc", respectively. The arrays Tother_1*c* and Tother_2*c* represent "the products of the oscillation period vector Vo5 and the weight vector $$K^T_{1\times r,1}$$

of the divided chip set DGa" and "the products of the oscillation period vector Vo5 and the weight vector $$K^T_{1\times r,2}$$

of the divided chip set DGb", respectively.

In Formula 4, the system clock period Tcycle is multiplied by a unit vector $u^T$ with a suitable number of columns to apply array subtraction. For simplicity, the unit vector $u^T$ is not shown in Formula 4. Accordingly, the training error L is related to: (1) the difference obtained by subtracting the product of the system clock period Tcycle and the unit vector from the product of one or more oscillation period vectors of each divided chip set and the weight vector of the divided chip set (i.e., the array Tmain), and (2) the difference obtained by subtracting the product of the system clock period Tcycle and the unit vector from the products of one or more oscillation period vectors of the divided chip set and the weight vector of each of the rest divided chip sets (i.e., the array Tother).

In step S330, the training error L will be provided to an optimizer 516 of the second neural network model 510. The optimizer 516 is configured to adjust the weights of the multi-layer neural structure 512, so as to adjust the weight vector $$K^T_{1\times r,1},$$

which in turn minimizes the training error L. The weight vectors $$K^T_{1\times r,1},\ K^T_{1\times r,2} \text{ and } K^T_{1\times r,3}$$

obtained when the training error L is minimized may be used as $$K^T_{1\times r,1}$$

in Formula 2 to construct Formula 2. It is worth mentioning that in the process of minimizing the training error L, the array Tmain will become larger than all respective arrays Tother. For example, each element of the array Tmain_a will be larger than elements in the respective entries in the array Tother_1*a* and the array Tother_2*a*, where the arrays Tmain_a, Tother_1*a* and Tother_2*a* are the products M1, M2 and M3 in FIG. 2, respectively.

In some embodiments, the method 300 further comprises step S340. In step S340, the computing system estimates a plurality of (e.g., 5) performance values of the aforementioned plurality of (e.g., 5) chips 100 according to the weight vectors $$K^T_{1\times r,1},\ K^T_{1\times r,2} \text{ and } K^T_{1\times r,3}.$$

More specifically, the computing system uses the weight vectors $$K^T_{1\times r,1},\ K^T_{1\times r,2} \text{ and } K^T_{1\times r,3}$$

obtained in steps S310-S330 to construct Formula 2, and then use Formula 2 to estimate the 5 performance values of the aforementioned 5 chips 100 (i.e., generating the array $Tes_{5\times 1}$ in FIG. 2). The process to estimate the plurality of performance values of the plurality of chips 100 has been described above with reference to FIG. 2. For simplicity, detailed description is omitted here. As mentioned before, each performance value represents the sum of the delay time and the setup time of the critical path 130 of a corresponding chip 100 of the plurality of chips 100 when the corresponding chip 100 is operated under the predetermined working voltage VDD.

Consequently, the method 300 may estimate a plurality of performance values of the plurality of chips 100 with different PVT-to-delay sensitivities accurately without extracting critical paths 130 of chips 100.

In some embodiments, the first neural network models 410A-410C, the 420 detection module and/or the second neural network model 510 may be implemented with a plurality of computer-readable instructions stored in a non-transitory computer-readable storage medium, and one or more processors in the computing system may execute the computer-readable instructions, so as to run the first neural network models 410A-410C, the detection module 420 and/or the second neural network model 510 on the computing system. In other embodiments, the first neural network models 410A-410C, the detection module 420 and/or the second neural network model 510 may be implemented with one or more processors in the computing system (e.g., application specific integrated circuits (ASICs) or field programmable gate arrays (FPGAs)), so as to run the first neural network models 410A-410C, the detection module 420 and/or the second neural network model 510 on the computing system.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Certain terms are used in the specification and the claims to refer to specific components. However, those of ordinary skill in the art would understand that the same components may be referred to by different terms. The specification and claims do not use the differences in terms as a way to distinguish components, but the differences in functions of the components are used as a basis for distinguishing. Furthermore, it should be understood that the term "comprising" used in the specification and claims is open-ended, that is, including but not limited to. In addition, "coupling" herein includes any direct and indirect connection means. Therefore, if it is described that the first component is coupled to the second component, it means that the first component can be directly connected to the second component through electrical connection or signal connections including wireless transmission, optical transmission, and the like, or the first component is indirectly electrically or signally connected to the second component through other component(s) or connection means.

It will be understood that, in the description herein and throughout the claims that follow, the phrase "and/or" includes any and all combinations of one or more of the associated listed items. Unless the context clearly dictates otherwise, the singular terms used herein include plural referents.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A method for estimating a plurality of performance values of a plurality of chips, comprising:

(A) using a plurality of oscillation period vectors of a to-be-divided chip set to train a first neural network model corresponding to the to-be-divided chip set, to obtain a training error of the to-be-divided chip set, wherein when step (A) is conducted for the first time, the to-be-divided chip set includes the plurality of chips;

(B) dividing the to-be-divided chip set into a plurality of divided chip sets according to the training error; and (C) using a plurality of oscillation period vectors of the plurality of divided chip sets as training data of a second neural network model, so that the second neural network model outputs a plurality of weight vectors respectively corresponding to the plurality of divided chip sets, wherein a product of one or more oscillation period vectors of each divided chip set and a weight vector of the divided chip set is larger than a product of the one or more oscillation period vectors of the divided chip set and a weight vector of each of rest of divided chip sets.

2. The method for estimating the plurality of performance values of the plurality of chips of claim 1, wherein step (A) comprises:

(a1) using the plurality of oscillation period vectors of the to-be-divided chip set as training data of the first neural network model, so that the first neural network model generates an initial weight vector corresponding to the to-be-divided chip set; and (a2) adjusting the initial weight vector to minimize the training error, wherein the training error is related to: (1) a product of a system clock period and a unit vector, and (2) a product of the plurality of oscillation period vectors of the to-be-divided chip set and the initial weight vector.

3. The method for estimating the plurality of performance values of the plurality of chips of claim 2, wherein step (B) comprises:

(b1) in response to the training error not being in a normal distribution, dividing the to-be-divided chip set into two chip sets;

(b2) using each of the two chip sets as the to-be-divided chip set, so as to repeat step (A) and step (B) on each of the two chip sets; and (b3) in response to the training error of each of a plurality of chip sets being in a normal distribution, using the plurality of chip sets as the plurality of divided chip sets to conduct step (C).

4. The method for estimating the plurality of performance values of the plurality of chips of claim 1, wherein step (C) comprises:

(c1) using the plurality of oscillation period vectors of the plurality of divided chip sets as training data of the second neural network model, so that the second neural network model outputs the plurality of weight vectors; and (c2) adjusting the plurality of weight vectors to minimize a training error of the plurality of divided chip sets, wherein the training error of the plurality of divided chip sets is related to: (1) a difference obtained by subtracting a product of a system clock period and a unit vector from a product of the one or more oscillation period vectors of each divided chip set and the weight vector of the divided chip set, and (2) a difference obtained by subtracting the product of the system clock period and the unit vector from a product of one or more oscillation period vectors of the divided chip set and the weight vector of each of rest of divided chip sets.

5. The method for estimating the plurality of performance values of the plurality of chips of claim 1, further comprising:

(D) estimating the plurality of performance values of the plurality of chips according to the plurality of weight vectors.

6. The method for estimating the plurality of performance values of the plurality of chips of claim 1, wherein each of the performance values represents a sum of a propagation delay and a setup time of a critical path of a respective one of the plurality of chips when the respective one of the plurality of chips is operated at a working voltage having a predetermined level.

7. The method for estimating the plurality of performance values of the plurality of chips of claim 1, wherein each of the first neural network model and the second neural network model is a feedforward neural network (FNN) model.

8. A non-transitory computer-readable storage medium configured to store one or more computer-readable instructions, when one or more processors executing the one or more computer-readable instructions, the one or more computer-readable instructions cause the one or more processors to conduct following steps to estimate a plurality of performance values of a plurality of chips:

(A) using a plurality of oscillation period vectors of a to-be-divided chip set to train a first neural network model corresponding to the to-be-divided chip set, to obtain a training error of the to-be-divided chip set, wherein when step (A) is conducted for the first time, the to-be-divided chip set includes the plurality of chips;

(B) dividing the to-be-divided chip set into a plurality of divided chip sets according to the training error; and (C) using a plurality of oscillation period vectors of the plurality of divided chip sets as training data of a second neural network model, so that the second neural network model outputs a plurality of weight vectors respectively corresponding to the plurality of divided chip sets, wherein a product of one or more oscillation period vectors of each divided chip set and a weight vector of the divided chip set is larger than a product of the one or more oscillation period vectors of the divided chip set and a weight vector of each of rest of divided chip sets.

9. The non-transitory computer-readable storage medium of claim 8, wherein step (A) comprises:

(a1) using the plurality of oscillation period vectors of the to-be-divided chip set as training data of the first neural network model, so that the first neural network model generates an initial weight vector corresponding to the to-be-divided chip set; and (a2) adjusting the initial weight vector to minimize the training error, wherein the training error is related to: (1) a product of a system clock period and a unit vector, and (2) a product of the plurality of oscillation period vectors of the to-be-divided chip set and the initial weight vector.

10. The non-transitory computer-readable storage medium of claim 9, wherein step (B) comprises:

(b1) in response to the training error not being in a normal distribution, dividing the to-be-divided chip set into two chip sets;

(b2) using each of the two chip sets as the to-be-divided chip set, so as to repeat step (A) and step (B) on each of the two chip sets; and (b3) in response to the training error of each of a plurality of chip sets being in a normal distribution, using the plurality of chip sets as the plurality of divided chip sets to conduct step (C).

11. The non-transitory computer-readable storage medium of claim 8, wherein step (C) comprises:

(c1) using the plurality of oscillation period vectors of the plurality of divided chip sets as training data of the second neural network model, so that the second neural network model outputs the plurality of weight vectors; and (c2) adjusting the plurality of weight vectors to minimize a training error of the plurality of divided chip sets, wherein the training error of the plurality of divided chip sets is related to: (1) a difference obtained by subtracting a product of a system clock period and a unit vector from a product of the one or more oscillation period vectors of each divided chip set and the weight vector of the divided chip set, and (2) a difference obtained by subtracting the product of the system clock period and the unit vector from a product of one or more oscillation period vectors of the divided chip set and the weight vector of each of rest of divided chip sets.

12. The non-transitory computer-readable storage medium of claim 8, wherein the one or more processors are further configured to conduct:

(D) estimating the plurality of performance values of the plurality of chips according to the plurality of weight vectors.

13. The non-transitory computer-readable storage medium of claim 8, wherein each of the performance values represents a sum of a propagation delay and a setup time of a critical path of a respective one of the plurality of chips when the respective one of the plurality of chips is operated at a working voltage having a predetermined level.

14. The non-transitory computer-readable storage medium of claim 8, wherein each of the first neural network model and the second neural network model is a feedforward neural network (FNN) model.

15. A computing system, comprising one or more processors, wherein the one or more processors are configured to conduct following steps to estimate a plurality of performance values of a plurality of chips:

(A) using a plurality of oscillation period vectors of a to-be-divided chip set to train a first neural network model corresponding to the to-be-divided chip set, to obtain a training error of the to-be-divided chip set, wherein when step (A) is conducted for the first time, the to-be-divided chip set includes the plurality of chips;

(B) dividing the to-be-divided chip set into a plurality of divided chip sets according to the training error; and (C) using a plurality of oscillation period vectors of the plurality of divided chip sets as training data of a second neural network model, so that the second neural network model outputs a plurality of weight vectors respectively corresponding to the plurality of divided chip sets, wherein a product of one or more oscillation period vectors of each divided chip set and a weight vector of the divided chip set is larger than a product of the one or more oscillation period vectors of the divided chip set and a weight vector of each of rest of divided chip sets.

16. The computing system of claim 15, wherein step (A) comprises:

(a1) using the plurality of oscillation period vectors of the to-be-divided chip set as training data of the first neural network model, so that the first neural network model generates an initial weight vector corresponding to the to-be-divided chip set; and (a2) adjusting the initial weight vector to minimize the training error, wherein the training error is related to: (1) a product of a system clock period and a unit vector, and (2) a product of the plurality of oscillation period vectors of the to-be-divided chip set and the initial weight vector.

17. The computing system of claim 16, wherein step (B) comprises:

(b1) in response to the training error not being in a normal distribution, dividing the to-be-divided chip set into two chip sets;

(b2) using each of the two chip sets as the to-be-divided chip set, so as to repeat step (A) and step (B) on each of the two chip sets; and (b3) in response to the training error of each of a plurality of chip sets being in a normal distribution, using the plurality of chip sets as the plurality of divided chip sets to conduct step (C).

18. The computing system of claim 15, wherein step (C) comprises:

(c1) using the plurality of oscillation period vectors as training data of the second neural network model, so that the second neural network model outputs the plurality of weight vectors; and (c2) adjusting the plurality of weight vectors to minimize a training error of the plurality of divided chip sets, wherein the training error of the plurality of divided chip sets is related to: (1) a difference obtained by subtracting a product of a system clock period and a unit vector from a product of the one or more oscillation period vectors of each divided chip set and the weight vector of the divided chip set, and (2) a difference obtained by subtracting the product of the system clock period and the unit vector from a product of one or more oscillation period vectors of the divided chip set and the weight vector of each of rest of divided chip sets.

19. The computing system of claim 15, wherein the one or more processors are further configured to conduct:

(D) estimating the plurality of performance values of the plurality of chips according to the plurality of weight vectors.

20. The computing system of claim 15, wherein each of the performance values represents a sum of a propagation delay and a setup time of a critical path of a respective one of the plurality of chips when the respective one of the plurality of chips is operated at a working voltage having a predetermined level.

* * * * *